(12) United States Patent
Yamamoto

(10) Patent No.: US 8,929,093 B2
(45) Date of Patent: Jan. 6, 2015

(54) JUNCTION BOX

(75) Inventor: Takeyoshi Yamamoto, Saitama (JP)

(73) Assignee: Honda Motor Co., Ltd., Tokyo (JP)

( * ) Notice: Subject to any disclaimer, the term of this patent is extended or adjusted under 35 U.S.C. 154(b) by 14 days.

(21) Appl. No.: 13/041,965

(22) Filed: Mar. 7, 2011

(65) Prior Publication Data
US 2011/0228497 A1    Sep. 22, 2011

(30) Foreign Application Priority Data

Mar. 18, 2010 (JP) ................................. 2010-062424

(51) Int. Cl.
H05K 1/11 (2006.01)
H05K 1/14 (2006.01)
H05K 1/03 (2006.01)

(52) U.S. Cl.
CPC .......... *H05K 1/144* (2013.01); *H05K 2201/042* (2013.01); *H05K 2201/09063* (2013.01); *H05K 2203/167* (2013.01)
USPC .......................................... 361/784; 174/255

(58) Field of Classification Search
USPC .......................................... 174/255, 260–263
See application file for complete search history.

(56) References Cited

U.S. PATENT DOCUMENTS

| 3,611,113 | A | * | 10/1971 | Cherry | 322/48 |
| 3,660,728 | A | * | 5/1972 | Carter | 361/789 |
| 3,742,309 | A | * | 6/1973 | Sterner | 361/790 |
| 4,079,278 | A | * | 3/1978 | Luneau | 310/181 |
| 5,049,982 | A | * | 9/1991 | Lee et al. | 257/722 |
| 5,249,973 | A | | 10/1993 | Fujita et al. | |
| 5,543,586 | A | * | 8/1996 | Crane et al. | 174/262 |
| 5,575,686 | A | * | 11/1996 | Noschese | 439/620.21 |
| 5,579,217 | A | * | 11/1996 | Deam et al. | 363/144 |
| 5,689,216 | A | * | 11/1997 | Sturdivant | 333/33 |
| 5,933,343 | A | * | 8/1999 | Lu et al. | 363/144 |
| 5,949,238 | A | * | 9/1999 | Marquis | 324/750.25 |

(Continued)

FOREIGN PATENT DOCUMENTS

| CN | 2559182 | 7/2003 |
| CN | 101291565 A | 10/2008 |

(Continued)

OTHER PUBLICATIONS

Official Action for Chinese Patent Application No. 201110065339.6.

(Continued)

*Primary Examiner* — Hoa C Nguyen
*Assistant Examiner* — Xanthia C Cunningham
(74) *Attorney, Agent, or Firm* — Mori & Ward, LLP

(57) ABSTRACT

Provided is a junction box 10 with an electric circuit formed by laminating a plurality of resinous plates 51, wherein a plurality of pole structures 61 is uprightly formed on a bottom (lower casing 60) of the junction box so as to be located at a position not overlapping the conductive patterns 52 of the laminated plates and to face a direction of penetrating the plates, in which a plurality of insertion holes 53 is formed in the resinous plates 51 so as to allow the pole structures 61 to be inserted therethrough, in which the plurality of pole structures 61 is formed to have different heights, and in which insertion holes 53 are formed in each of the resinous plates 51 so as to allow the pole structures 61 to be inserted therethrough and to match with the heights of the pole structures 61 having different heights.

2 Claims, 4 Drawing Sheets

(56) References Cited

U.S. PATENT DOCUMENTS

| | | | |
|---|---|---|---|
| 5,956,835 A * | 9/1999 | Aksu | 29/468 |
| 5,963,432 A * | 10/1999 | Crowley | 361/804 |
| 6,137,064 A * | 10/2000 | Kiani et al. | 174/266 |
| 6,249,442 B1 | 6/2001 | Watanabe | |
| 6,388,208 B1 * | 5/2002 | Kiani et al. | 174/266 |
| 6,512,181 B2 * | 1/2003 | Okubo et al. | 174/255 |
| 6,818,839 B2 * | 11/2004 | Hosaka et al. | 174/262 |
| 7,154,047 B2 * | 12/2006 | Howard | 174/260 |
| 7,193,307 B2 * | 3/2007 | Duggan et al. | 257/686 |
| 7,239,526 B1 * | 7/2007 | Bibee | 361/788 |
| 7,247,031 B2 * | 7/2007 | Naito et al. | 439/75 |
| 7,292,453 B2 * | 11/2007 | Naruse | 361/784 |
| 7,883,342 B2 * | 2/2011 | Yoshida et al. | 439/76.2 |
| 7,989,708 B2 * | 8/2011 | Takada | 174/262 |
| 8,231,414 B2 * | 7/2012 | Heipp et al. | 439/700 |
| 2001/0009032 A1 * | 7/2001 | Mohsen | 716/15 |
| 2002/0040809 A1 | 4/2002 | Okubo et al. | |
| 2003/0047353 A1 * | 3/2003 | Yamaguchi et al. | 174/260 |
| 2003/0116351 A1 * | 6/2003 | Brodsky et al. | 174/262 |
| 2005/0202722 A1 * | 9/2005 | Regnier et al. | 439/608 |
| 2006/0081065 A1 * | 4/2006 | Heipp et al. | 73/856 |
| 2008/0227311 A1 * | 9/2008 | Chan et al. | 439/74 |
| 2008/0268671 A1 * | 10/2008 | Harris | 439/76.2 |
| 2008/0310133 A1 | 12/2008 | Yoshida et al. | |
| 2009/0023313 A1 * | 1/2009 | Hayakawa | 439/76.2 |
| 2009/0040741 A1 * | 2/2009 | Hayashi et al. | 361/794 |
| 2009/0107717 A1 * | 4/2009 | Hsu et al. | 174/262 |
| 2010/0107758 A1 * | 5/2010 | Kandori et al. | 73/504.08 |
| 2010/0140613 A1 * | 6/2010 | Kimura | 257/43 |
| 2010/0207651 A1 * | 8/2010 | Suto | 324/754 |
| 2010/0208425 A1 * | 8/2010 | Rapisarda | 361/692 |

FOREIGN PATENT DOCUMENTS

| | | |
|---|---|---|
| JP | 05-036452 | 2/1993 |
| JP | 2000-165068 | 6/2000 |
| JP | 2002-271058 | 9/2002 |
| JP | 2008-220165 A | 9/2008 |

OTHER PUBLICATIONS

Chinese Official Action dated Oct. 21, 2013.

* cited by examiner

JUNCTION BOX

TECHNICAL FIELD

The present invention relates to a junction box with an electric circuit formed by laminating plural plates each having a conductive pattern, and particularly, to a conduction part holding mechanism of a junction box when plural plates are laminated.

BACKGROUND ART

A junction box is a box which accommodates collectively connection portions of wires at one position therein. For example, as disclosed in Japanese Patent Application Laid-Open (JP-A) No. 2008-220165, the junction box has a structure in which a circuit unit is formed by laminating plural resinous plates (circuit boards) each having a foil circuit (conductive pattern), and a circuit casing is formed by fitting upper and lower casings to each other.

Column-like anchor pins are integrally formed with the resinous plates formed of a synthetic resin so as to protrude upward from plural positions of the resinous plates, the anchor pins are inserted through pin holes provided in the foil circuit formed of copper foil or the like, and the upper portions of the anchor pins are pressed and crushed by heat, so that the foil circuit is positioned and fixed to the resinous plates.

Further, the foil circuits of the resinous plates are connected to each other via a bus bar (an insertion terminal formed by a conductive member) penetrating through the resinous plates.

CITATION LIST

Patent Literature

Patent Literature 1 Japanese Patent Application Laid-Open No. 2008-220165

SUMMARY OF INVENTION

Technical Problem

However, when the junction box having the above-described configuration is used in, for example, a generator circuit of an engine generator, the copper foil of the foil circuit on the resinous plate may be peeled off or dropped therefrom due to vibration or impact during an operation therefore. In this case, a problem may arise in that the circuits are not electrically connected to each other or the circuits are short-circuited to each other when the foil circuits contact the foil circuits of other circuits formed on the same resinous plate.

Further, since the foil circuits formed on the resinous plates are generally different from each other, a problem may arise in that a desired circuit is not formed or other circuits are formed when the resinous plates are laminated in a different lamination order.

The invention is made in view of such circumstances, and an object of the invention is to improve reliability in electric conduction of a junction box formed by laminating plural plates each having a conductive pattern.

Solution to Problem

To achieve the above object, the present invention of the claim 1 is a junction box (10) with an electric circuit formed by laminating a plurality of plates (51) each having a conductive pattern (52) thereon and connecting the desired conductive patterns to each other by terminals (52a)penetrating (52b)the laminated plates, the junction box comprising:

a plurality of pole structures (61) which is uprightly formed on a bottom surface of the junction box so as to be located at a position not overlapping the conductive patterns (52) of the laminated plates and to face a direction of penetrating the plates; and a plurality of insertion holes (53) which is formed in the plates (51) so as to allow the pole structures (61) to be inserted therethrough.

The present invention of the claim 2 is the junction box according to claim 1, wherein the plurality of pole structures (61) is formed to have different heights, and wherein insertion holes (53) are formed in each of the plates (51) so as to allow the pole structures (61) to be inserted therethrough and to match with the heights of the pole structures (61) having different heights.

Advantageous Effects of Invention

According to the configuration of the first feature (claim 1), since the movement of the peeled-off or separated conductive pattern (52) is restricted by the pole structure (61) even when the conductive pattern (52) is peeled off or separated from the plate (51) due to vibration or impact, the contact with other conductive patterns may be prevented, and the positional deviation between the plates may be suppressed.

According to the configuration of the second feature (claim 2), since the pole structures (61) having different heights are provided in each plate (51), and the insertion holes (53) are provided in each plate so as to match with the heights of the pole structures (61), a structure may be obtained in which the pole structures (61) are not inserted into the insertion holes (53) in a wrong lamination order of the plates (51).

DESCRIPTION OF EMBODIMENTS

Hereinafter, an exemplary embodiment of a junction box of the invention will be described with reference to the accompanying drawings. The junction box of the invention is used in an operating machine equipped with an engine and performing various operations, and is applied to, for example, an engine generator 1 as shown in FIG. 1.

Figure 1:
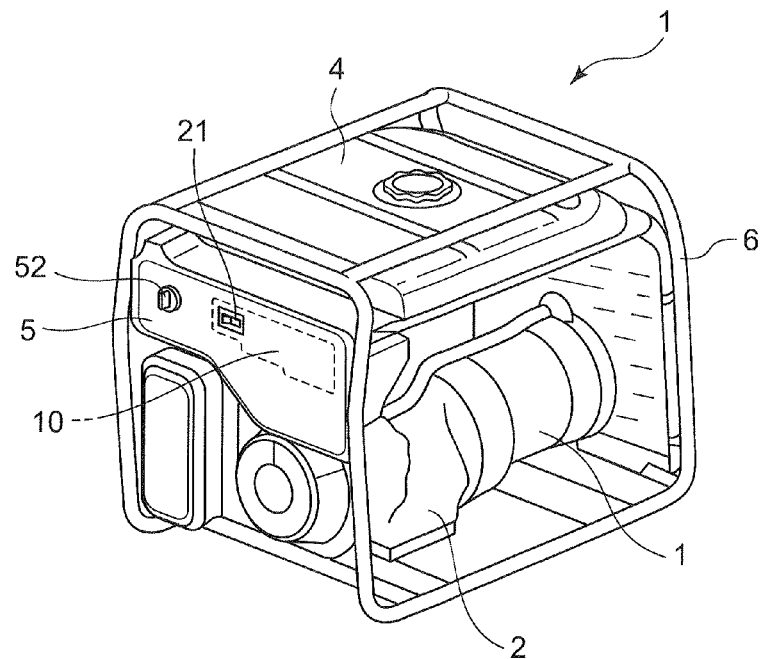
FIG. 1 is a perspective view illustrating the appearance of an engine generator using a junction box according to an embodiment of the invention.

The electric part connection mechanism of the operating machine of the invention is applied to an engine generator (operating machine) 1 as shown in FIG. 1. The engine generator 1 has a structure in which, on a frame 6, an engine 2 which is driven by gasoline, an AC generator 3 which is driven by the engine 2 so as to generate electricity, a fuel tank 4 which contains gasoline therein, and a control panel (operation panel) 5 which is used to perform various operations, and the like are mounted.

The control panel 5 is equipped with a start switch 51 which is used to start a driving operation of the engine, a voltage switching switch 21 which is used to switch an output voltage (100 V and 200 V), various display units (not shown) which are used to display an operation status thereon, and the like.

Figure 2:
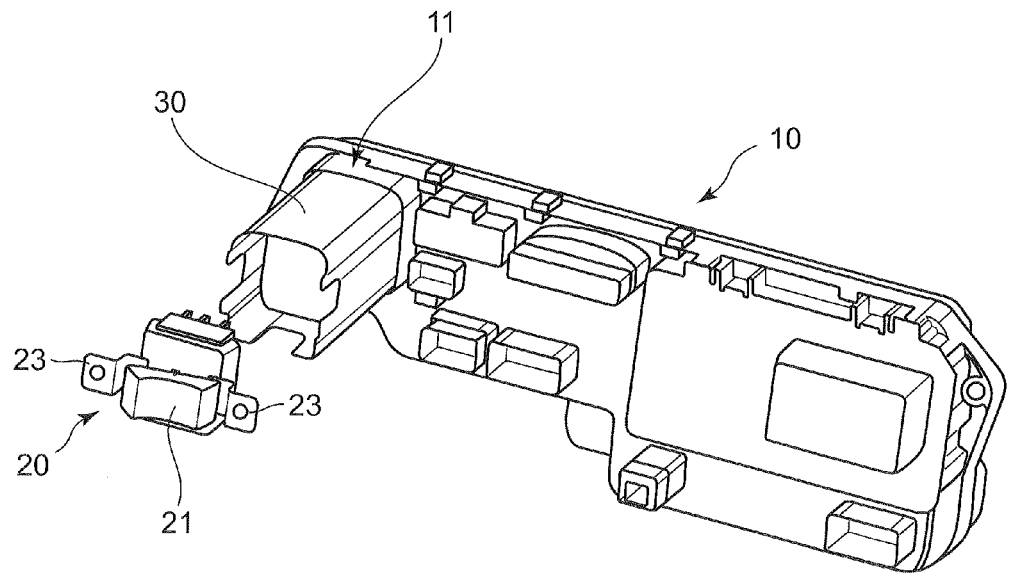
FIG. 2 is a perspective view illustrating a usage example of the junction box according to the embodiment of the invention.
Figure 3:
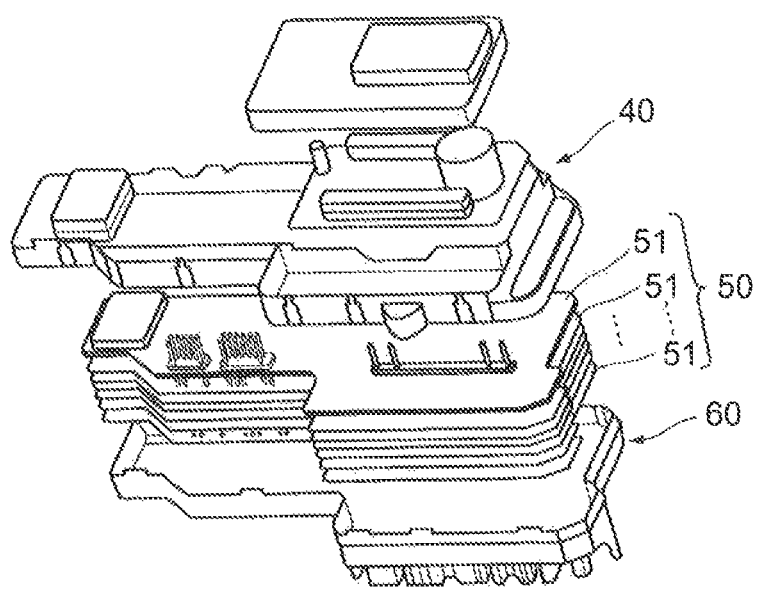
FIG. 3 is a perspective view illustrating an exploded structure of the junction box according to the embodiment of the invention.

As shown in FIGS. 2 and 3, a junction box 10 constituting a control panel casing is disposed at the rear side of the control panel 5. An assembling terminal 11 is formed at the left position of the junction box 10 so as to be connected to an electric circuit of the junction box 10.

An assembling terminal 11 of a junction box 10 is connected to a switch portion 20 mounted on a control panel 5 via a relay connector 30 of a cylindrical body.

The switch portion 20 is used to switch the connection of the generator circuit (a circuit of an operating machine) 13 of the junction box 10 so that the voltage supplied from the engine generator 1 is switched when the voltage switching switch 21 disposed on the front surface of the control panel 5 is switched. Further, plural male terminals 23 are disposed on the rear surface of the switch portion 20 in a protruding manner, where the male terminals 23 are connected to the internal circuit so that the connection status thereof is changed when the voltage switching switch 21 is switched.

As shown in FIG. 3, the junction box 10 is configured such that a laminated circuit 50 formed by laminating plural resinous plates 51 is fitted to upper and lower casings 40 and 60. Each of the resinous plates 51, the upper casing 40, and the lower casing 60 is formed of an insulating resin by injection molding.

A conductive pattern is formed on each resinous plate 51 in the form of a predetermined pattern by using a copper foil, and a conductive insertion terminal (not shown) penetrates the resinous plates 51 so that the desired conductive patterns are connected to each other and an electric circuit is formed.

The upper casing 30 and the lower casing 40 may be provided with a terminal and the like connected to the electric circuit if necessary.

Figure 4:
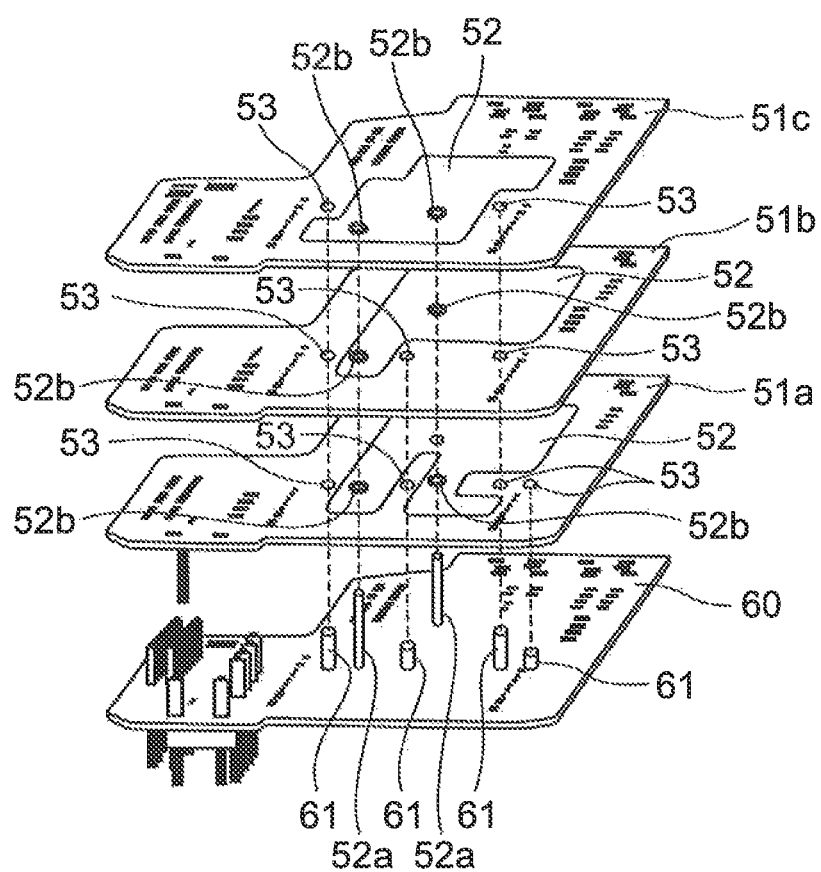
FIG. 4 is a perspective view illustrating an exploded structure of a circuit unit constituting the junction box according to the embodiment of the invention.
Figure 5:
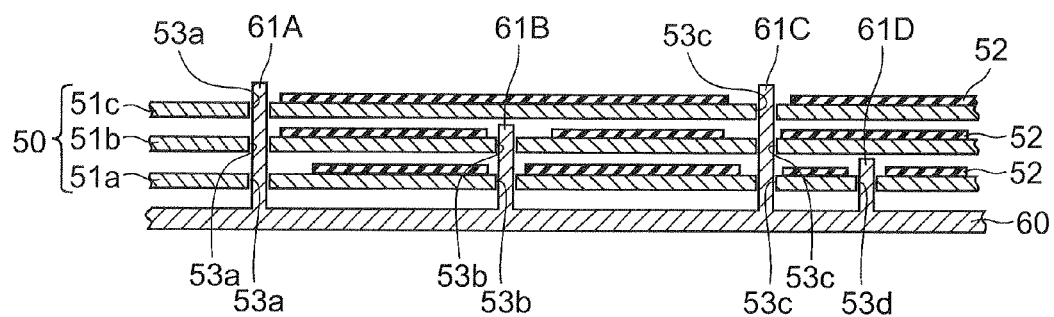
FIG. 5 is a cross-sectional view illustrating the circuit unit of the junction box according to the embodiment of the invention.

The arrangement relationship in the circuit unit between the laminated circuit 50 formed by laminating plural resinous plates 51 and the lower casing 60 of the junction box 10 will be described with reference to FIGS. 4 and 5. Further, the shapes of the resinous plates 51 and the lower casing 60 shown in FIGS. 4 and 5 are different from those of the resinous plates 51 and the lower casing 60 shown in FIG. 3.

Plural column-like pole structures 61 are uprightly formed in the lower casing 60 as the bottom of the junction box 10 so as to penetrate the resinous plates 51. The pole structures 61 are integrally formed when the lower casing 60 is injection-molded. Further, each conductive pattern 52 is formed on each of the resinous plates 51.

The number of the pole structures 61 is equal to or more than the number of the laminated resinous plates 51. In the examples of FIGS. 4 and 5, four pole structures 61 are provided with respect to three resinous plates 51. An insertion hole 53 is perforated in each resinous plate 51 so as to be located at a position not overlapping each conductive pattern 52 and to allow each pole structure 61 to pass therethrough.

Each pole structure 61 is formed so as to have a height corresponding to a difference in the height of the laminated resinous plates 51. Further, the insertion hole 53 is formed in the resinous plate 51 so as to allow each pole structure 61 to be inserted therethrough and to match with the heights of the pole structures 61 having different heights. That is, a minimum number of insertion holes 53 are formed in each resinous plate 51 so as to allow the pole structures 61 having different heights to be inserted therethrough.

For example, in the examples of FIGS. 4 and 5, the resinous plate lamination side of the lower casing 60 is provided with a pole structure 61A penetrating three resinous plates 51a, 51b, and 51c, a pole structure 61B penetrating two resinous plates 51a and 51b, a pole structure 61C penetrating three resinous plates 51a, 51b, and 51c, and a pole structure 61D penetrating only one resinous plate 51a.

Then, the resinous plate 51a is provided with an insertion hole 53a through which the pole structure 61A passes, an insertion hole 53b through which the pole structure 61B passes, an insertion hole 53c through which the pole structure 61C passes, and an insertion hole 53d through which the pole structure 61D passes.

The resinous plate 51b is provided with the insertion hole 53a through which the pole structure 61A passes, the insertion hole 53b through which the pole structure 61B passes, and the insertion hole 53c through which the pole structure 61c passes.

The resinous plate 51c is provided with the insertion hole 53a through which the pole structure 61A passes through, and the insertion hole 53c through which the pole structure 61C passes.

The pole structures 61A, 61B, 61C, and 61D having different heights are provided in the resinous plates 51a, 51b, and 51c, and the insertion holes 53a, 53b, 53c, and 53d are provided in the pole structures 61 of the resinous plates 51. Accordingly, only the resinous plate 51a having the insertion holes 53a, 53b, 53c, and 53d may be placed at the first layer of the lower casing 60, only the resinous plate 51b having the insertion holes 53a, 53b, and 53c may be placed thereon, and only the resinous plate 51c may be placed thereon. Therefore, the laminated circuit 50 may have a structure in which the pole structures 61 may not be inserted through the insertion holes 53 when the resinous plates 51 are laminated in a wrong lamination order.

That is, since the pole structures 61 have heights corresponding to a difference in the height of the resinous plates 51, the resinous plates 51 may not be laminated in a wrong lamination order.

In the examples of FIGS. 4 and 5, although the pole structures 61A, 61B, and 61C are depicted to be disposed on the same line of the lower casing 60 for the convenience of description in the cross-sectional view of FIG. 5, the pole structures may not be disposed in the linear shape, but may be disposed at any position so long as the conductive pattern 52 is not formed in the lower casing 60 (a position not overlapping the conductive pattern 52).

Further, in the above-described example, the pole structure 61 is uprightly formed in the lower casing 60 as the bottom of the junction box. However, when the lower casing 60 is simply a lower cover of the junction box 10, the resinous plate 51 located at the lowermost layer of the laminated circuit 50 may be used as the bottom of the junction box 10, and the pole structure 61 may be provided thereon.

According to the above-described configuration, even when the conductive pattern 52 is peeled off or separated from the resinous plate 51 due to vibration or impact when operating the engine generator 1, the peeled-off or separated conductive pattern 52 may tend to move on the plate surface. However, since the conductive pattern comes into contact with the pole structures 61, the conductive pattern is prevented from contacting other conductive patterns, and hence a problem caused by the peeled-off or separated conductive pattern may be prevented in the electric circuit.

Further, since the position of the resinous plate 51 is fixed by the pole structures 61, the positional deviation between the resinous plates may be suppressed.

Furthermore, the pole structures 61 having different heights are provided in the lower casing 60 as the bottom of the junction box 10, and the insertion holes 53 are perforated in the resinous plates 51 according to the heights of the pole structures 61. Accordingly, since the pole structures 61 may not be inserted through the insertion holes 53 when the lamination order of the resinous plates 51 is not correct, a difference in the lamination order may be easily checked.

In the above-described example, an example has been described in which the junction box 10 of the invention is applied to the engine generator 1, but the invention may be applied to junction boxes of other operating machines (pump and the like) in which vibration or impact is easily generated by an engine.

REFERENCE SIGNS LIST

1: ENGINE GENERATOR
2: ENGINE
3: AC GENERATOR
4: FUEL TANK
5: CONTROL PANEL (OPERATION PANEL)
10: JUNCTION BOX
11: ASSEMBLING TERMINAL
20: SWITCH PORTION
21: VOLTAGE SWITCHING SWITCH
30: RELAY CONNECTOR
40: UPPER CASING
50: LAMINATED CIRCUIT
51: RESINOUS PLATE (PLATE)
52: CONDUCTIVE PATTERN
53: INSERTION HOLE
60: LOWER CASING
61: POLE STRUCTURE

The invention claimed is:

1. A junction box with an electric circuit formed by laminating a plurality of plates each having a conductive pattern on a surface thereof and connecting the desired conductive patterns to each other by one or more terminals penetrating the laminated plates, the junction box comprising:

a plurality of pole structures which is uprightly formed on a bottom surface of the junction box so as to be located at a position not contacting the conductive patterns of the laminated plates and to face a direction of penetrating the plates; and a plurality of insertion holes which is formed in the plates so as to allow the pole structures to be inserted therethrough;

wherein each of the plurality of plates has the same shape when viewed in a direction orthogonal to the surface, wherein the plurality of pole structures is formed to have a plurality of different heights, and wherein the plurality of plates is arranged in a predetermined order in such a way that among the plates having insertion holes to allow the pole structures to be inserted therethrough, at least a first plate has the same number of insertion holes as the number of the pole structures such that all pole structures are allowed to insert therethrough;

at least a second plate has one less hole than the number of the pole structures such that all the pole structures except the shortest pole structure are allowed to insert therethrough; and at least a third plate has two less holes than the number of the pole structures such that all the pole structures except the shortest and the second shortest pole structures are allowed to insert therethrough.

2. The junction box according to claim 1, wherein the at least one first plate is different from the bottom surface of the junction box.

* * * * *